United States Patent
Hummler

(10) Patent No.: US 7,401,270 B2
(45) Date of Patent: Jul. 15, 2008

(54) REPAIR OF SEMICONDUCTOR MEMORY DEVICE VIA EXTERNAL COMMAND

(75) Inventor: Klaus Hummler, Apex, NC (US)

(73) Assignee: Infineon Technologies AG, Neubiberg (DE)

( * ) Notice: Subject to any disclaimer, the term of this patent is extended or adjusted under 35 U.S.C. 154(b) by 182 days.

(21) Appl. No.: 11/253,728

(22) Filed: Oct. 20, 2005

(65) Prior Publication Data

US 2007/0113121 A1    May 17, 2007

(51) Int. Cl.
*G11C 29/00* (2006.01)
(52) U.S. Cl. ...................................................... 714/710
(58) Field of Classification Search ................. 714/710, 714/711; 365/200
See application file for complete search history.

(56) References Cited

U.S. PATENT DOCUMENTS

| | | | |
|---|---|---|---|
| 5,270,974 A * | 12/1993 | Reddy | 365/200 |
| 5,581,508 A * | 12/1996 | Sasaki et al. | 365/200 |
| 6,285,603 B1 | 9/2001 | Ku et al. | |
| 6,304,989 B1 * | 10/2001 | Kraus et al. | 714/733 |
| 6,571,352 B2 | 5/2003 | Blodgett | |
| 6,574,159 B2 * | 6/2003 | Ohbayashi et al. | 365/201 |
| 6,829,736 B1 * | 12/2004 | Marinissen et al. | 714/711 |
| 6,910,152 B2 * | 6/2005 | Blodgett | 714/6 |
| 7,137,055 B2 * | 11/2006 | Hirano et al. | 714/738 |
| 7,155,637 B2 * | 12/2006 | Jarboe et al. | 714/8 |
| 7,221,604 B2 * | 5/2007 | Cheng et al. | 365/200 |
| 7,228,468 B2 * | 6/2007 | Wu et al. | 714/710 |

* cited by examiner

*Primary Examiner*—James C Kerveros
(74) *Attorney, Agent, or Firm*—Edell, Shapiro & Finnan, LLC

(57) ABSTRACT

A semiconductor integrated circuit memory device is repaired by receiving an externally-supplied signal containing failure information that identifies at least row or column of memory cells in the memory device that has a failure. The externally-supplied signal contains failure information derived from error correction or other failure logs. The failure information is stored in the memory device and used for comparison against an incoming memory request. If a match is detected between the failure address information and the incoming memory request, then a redundant row or column is used for the memory access request. The repair feature may be performed during power up of the memory device, or normal operation may interrupted by a repair command that places the memory device in a standby mode for the repair.

28 Claims, 6 Drawing Sheets

REPAIR OF SEMICONDUCTOR MEMORY DEVICE VIA EXTERNAL COMMAND

BACKGROUND OF THE INVENTION

The present invention relates to semiconductor memory integrated circuit devices, such as dynamic random access memory (DRAM) devices, and more particularly to repairing a memory device when it is deployed in a memory module in a computing system.

With the increasing density of memory modules, such as dual in-line memory modules (DIMMs), sparse failures of the DRAM chips that make up the memory modules become an increasing economic concern for the memory manufacturer. At the same time, computer system manufacturers of large server computers face an increasing challenge in achieving the desired reliability of their systems with ever-increasing memory capacities. Currently, computer systems collect fail addresses (via failure scrubbing and error correction logs) but they do not repair failing addresses until the entire memory module with the affected memory device is exchanged during the next maintenance downtime.

Therefore, the capability of an in-situ repair of faulty memory addresses while the system is running would be highly beneficial to both memory manufacturers and system manufacturers.

SUMMARY OF THE INVENTION

Briefly, a semiconductor integrated circuit memory device is repaired by receiving an externally-supplied signal containing failure address information that identifies at least one row or column of memory cells in the memory device that has a failure. The externally-supplied signal contains failure information derived from error correction or other failure logs. The failure information is stored in the memory device and used for comparison against an incoming memory request. If a match is detected between the failure information and the incoming memory request, then a redundant row or column is used for the memory access request. The repair feature may be performed during power up of the memory device, or normal operation may interrupted by a repair command that places the memory device in a standby mode for the repair. The failure information may be transferred to a latch in the memory device as part of a fuse bank scanning process in which failure address information known at the time of manufacturer is burned into one or more fuse banks.

DETAILED DESCRIPTION

Figure 1:
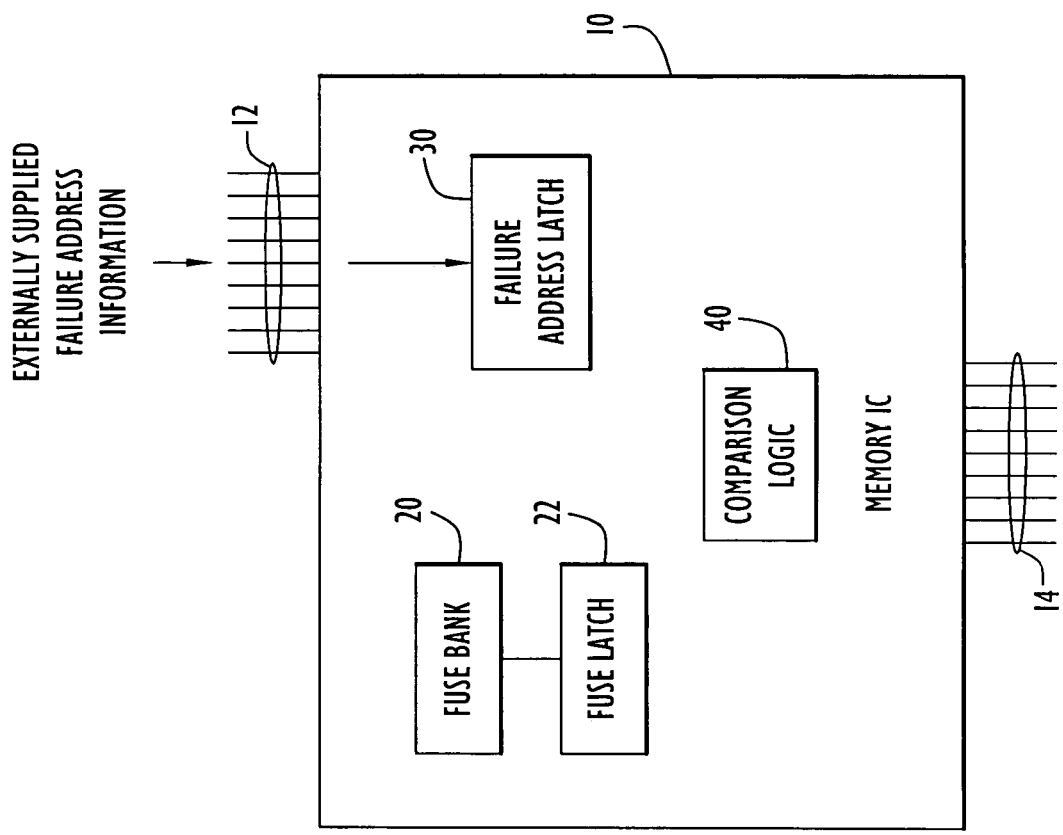
FIG. 1 is a block diagram of a memory device according to the invention.

Referring first to FIG. 1, a semiconductor memory integrated circuit (IC) device is shown at reference numeral 10 comprising a plurality of address lines 12 and a plurality of data lines 14. In the memory device 10, there is at least one fuse bank 20 and an associated fuse latch 22. It should be understood that, while FIG. 1 shows a single fuse bank 20 and fuse latch 22, in most memory device applications, there are multiple fuse banks and associated fuse latches. For simplicity, only one of each is shown. In addition, there is a failure address latch 30 and comparison logic circuitry 40.

According to the invention, an external repair command is provided to allow for a system user to supply failure information to the memory device 10 and issue a repair command. The failure information is supplied to the memory device 10 at the address lines or pins 12, and optionally at the data pins or DQs 14 as well, and stored in the failure address latch 30. Similarly, failure information determined in the final stages of manufacturer of the memory device 10 is stored in the fuse bank, and latched into the fuse latch 22 at system power up. Then, during normal memory access operations, the comparison logic circuitry 40 compares the incoming address requests with both the failure information stored in the fuse latch 22 and the failure address information stored in the address latch 30 in order to access redundant memory cells when there is a match. Latches 22 and 30 may be the same type of electrical element. As is known in the art, latches are a type of fast logic circuitry typically formed of transistors arranged in a flip-flop configuration to store data as long as power is applied to the chips.

The externally supplied failure address information may be derived from error correction and address failure logs accumulated by the host computer system as is known in the art. After the externally supplied failure information is loaded into the memory device, the memory device would appear perfect to the system after the repair by virtue of the operation of the comparison logic circuitry 40. Consequently, this would mean that in less expensive computer systems, non-perfect memory ICs could be used, and in high performance computer systems, reliability can be improved. Repairing the memory device so as to look "perfect" to the system may be preferable to re-mapping failing addresses during operation on the controller or CPU level with respect to impact on system performance. For backwards compatibility, the repair command has to be a command which is illegal or reserved in today's memory applications. This could most easily be achieved by coupling the issuing of the repair command to an extended mode register setting.

Figure 2:
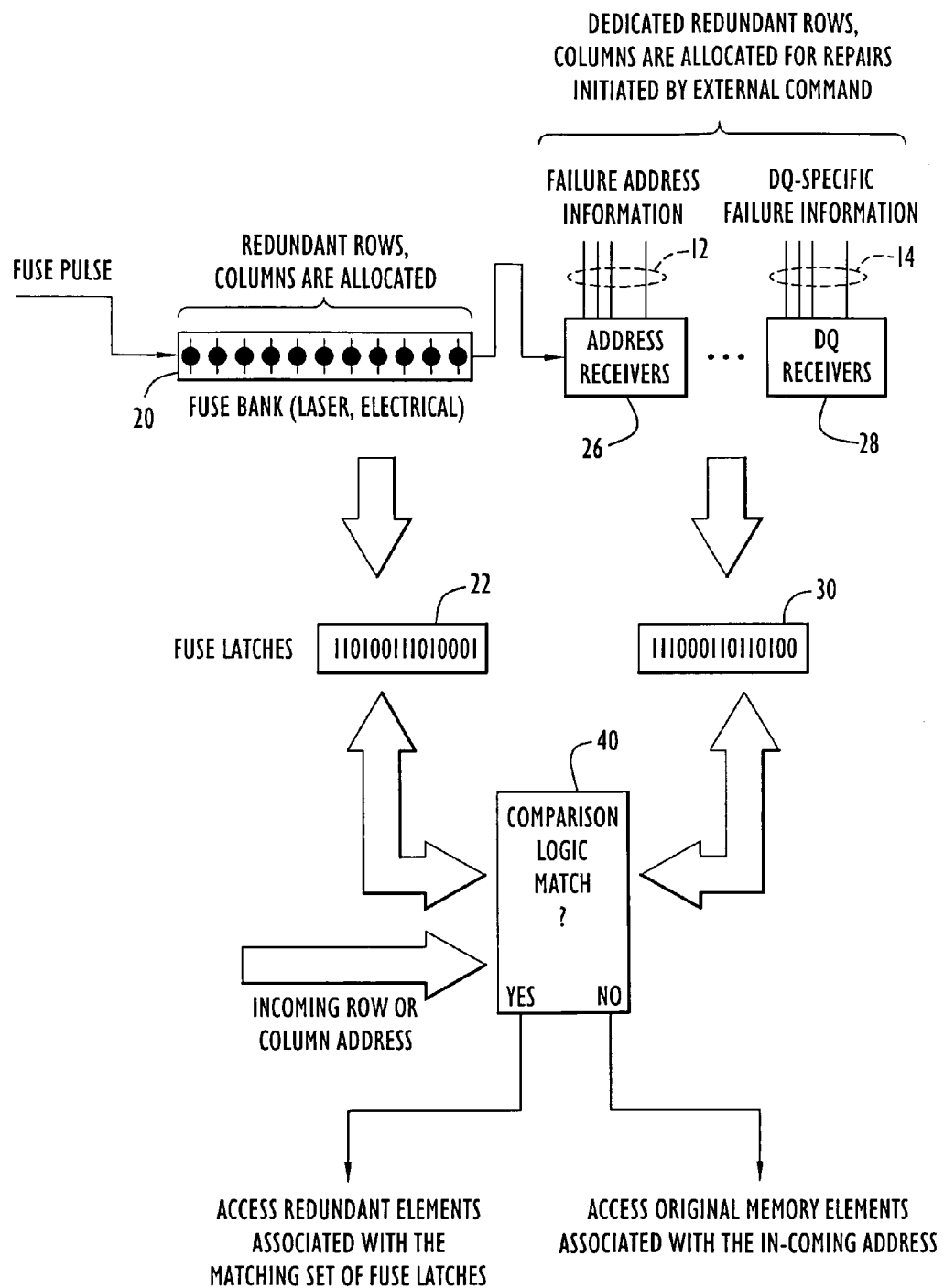
FIG. 2 is a flow diagram depicting operation of the invention.

Turning to FIG. 2, the invention is described in greater detail. Some memory devices, such as DRAMs, repair failures via spare or redundant rows. It is to be desirable to distinguish between a row repair and a column repair via two different repair commands. This would enable the user to furnish all failure address information back to the memory device within one cycle by applying the failure address to the address bus of the memory device, as also indicated in FIG. 1. The address lines 12 are coupled to address receivers 26 and the DQs 14 are coupled to DQ receivers 28. Some memory redundancy may replace cells corresponding to only a subset of the DQs 12 of the memory device 10. In this case, the system user may also apply signals to the DQs 12 of the memory device 10 to indicate which DQs are failing. The failure information may consist of an address supplied on the address lines 12 and, if it is desired to identify the particular cell or cells that require repair, then the corresponding DQ-specific failure information may be supplied on the DQs 14. For example, a particular memory cell in the memory array may be identified by the combination of failure address information (identifying a row or column) together with failure DQ information. The failure DQ information may consist of a pre-defined signal supplied to the DQs 12 such that a failing DQ is identified with a logic one applied thereto and a passing or normally functioning DQ is identified with a logic zero.

According to one embodiment, a technique that is backwards compatible with existing memory devices and does not involve the definition of a new command is as follows. Some memory devices, such as DRAMs, perform a scan of the fuse banks at power up in order to capture and store the state of all fuses (laser or electrical) into latches for fast processing of the information during operation. This so-called fuse pulse travels around the chip scanning all existing fuses. This invention proposes to extend the fuse pulse to also scan the address pins and DQs of the memory device and treat this information as a repair request for a column or row address (or DQs to identify particular cells) as shown in FIGS. 1 and 2. For the failed memory addresses (or cells) identified via the external command or signal, dedicated row or column redundancy may be used to replace the original (but now failing) memory array cells corresponding to the failure information. This will allow the system to distinguish between cells that were determined to be failing at manufacture versus cells that were determined to be failing after the memory device has been deployed and is in use.

Figure 3:
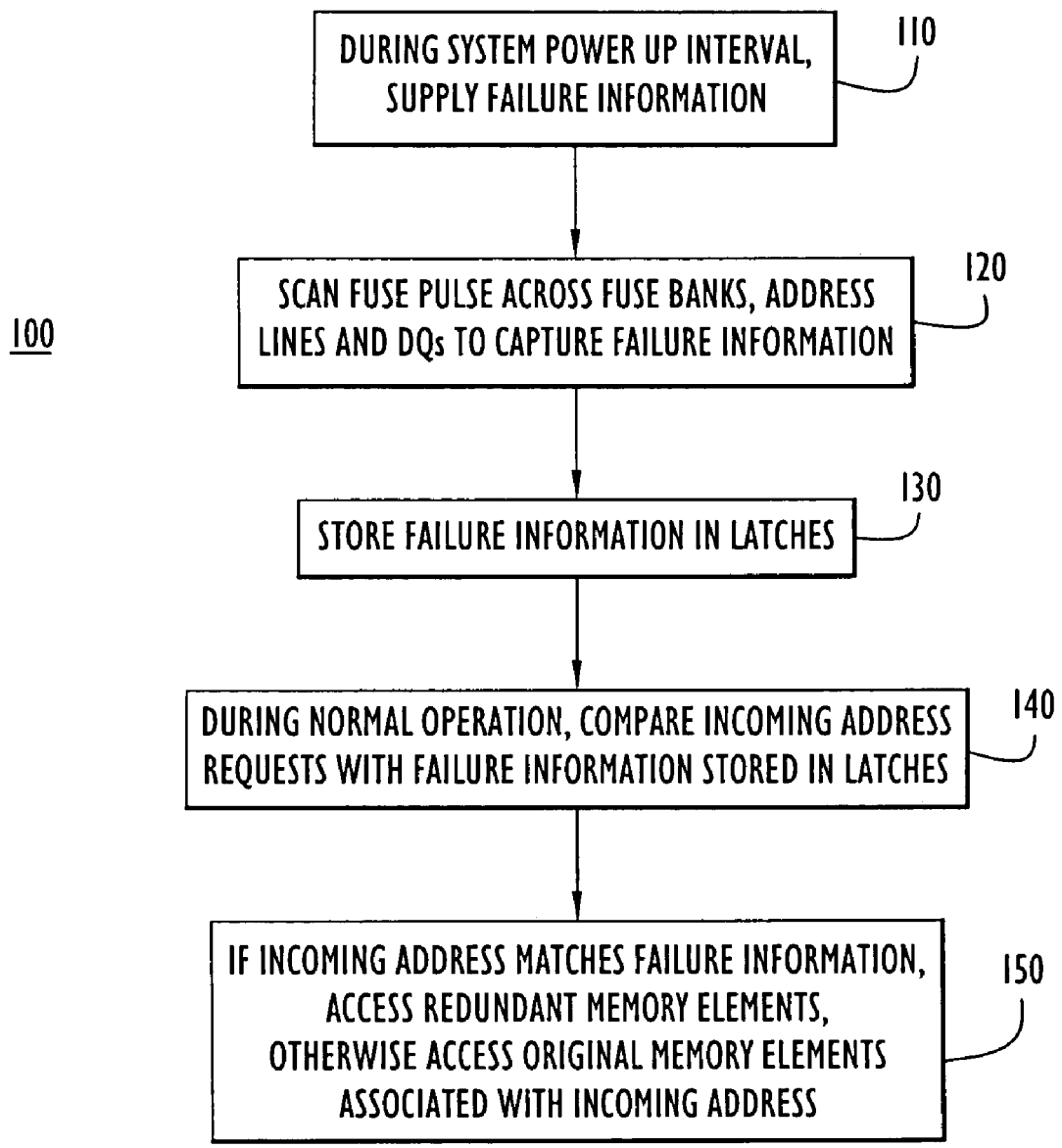
FIG. 3 is a flow chart according to a first embodiment of the invention.

Reference is now made to FIG. 3 that shows a repair process 100 that will be explained in conjunction with FIG. 2. In step 110, when the system in which the memory device is powering up, a short time interval is set aside during which failure information is supplied to the device 10 at the address lines or DQs as shown in FIG. 2. For example, the system applies a 200 μs stable clock to the memory components after all external voltages have been stabilized. Typically, the external supply voltage and the main internal voltage of the memory component are ready for operation very early in the power-up process. Therefore, the address and DQ receivers 26 and 28, respectively, and latches 22 and 30 will operate correctly even if other internal voltages are not yet at their correct levels. This provides an ample time window to apply the failure address information and add them internally to the fuse information for the dedicated redundancy elements.

Next, in step 120, the fuse pulse is scanned across the fuse banks, e.g., fuse bank 20, and across the address lines 12, and optionally the DQs 14, to capture the failure information. In step 130, the externally supplied failure information is stored in the latch 30. The failure information from the fuse bank 20 is stored in the fuse latch 22. Next, during normal system operation, the comparison logic 40 compares an incoming address request (row or column) with the failure information from the fuse latch 22 and latch 30. In step 150, if there is a match, then a redundant row or column is accessed instead of the incoming requested address. In particular, if there is a match between the incoming address request and the failure information stored in latch 30, one of the dedicated rows or columns is used instead of the address in the incoming address request. If there is a match between the incoming address request and address information stored in a fuse bank, then one of the non-dedicated rows or columns is used. On the other hand, if there is no match between the incoming address request and the failure information, then the memory address contained in the incoming request is used. The term "match" means, in this case of the techniques described herein, that the incoming memory request is for a row or column that contains at least one failing storage cell.

This process 100 is completely transparent to current JEDEC standards. If the system user does not wish to replace an externally provided memory address, the memory device would just replace whatever address happens to be applied in the fuse banks at power up. This will not cause any harm to the functionality of the memory device. However, a limitation of the process 100 is that the time interval during system power-up is likely only long enough to allow for a single address to be applied and stored in the latch 30.

Figure 4:
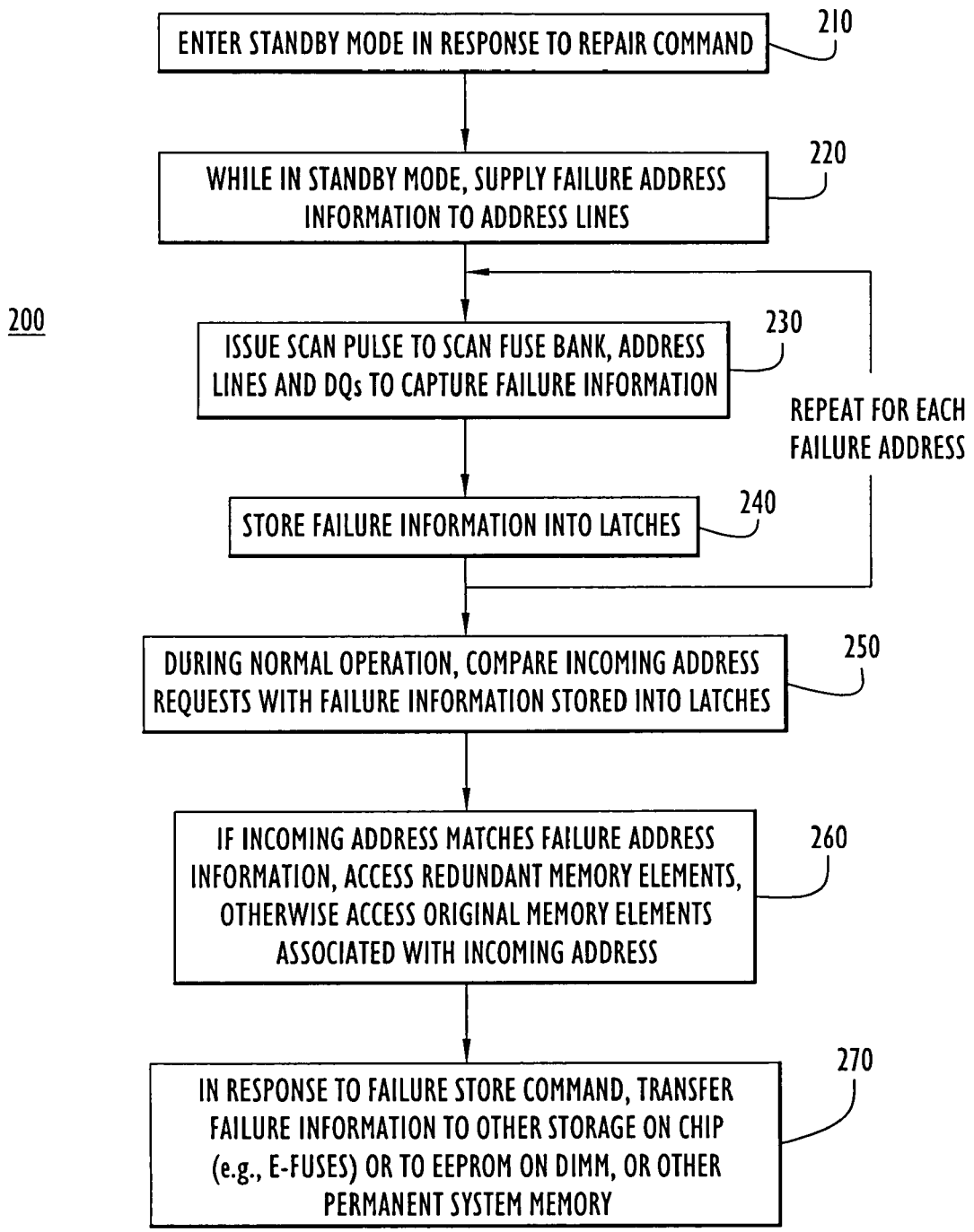
FIG. 4 is a flow chart according to a second embodiment of the invention.

Turning to FIG. 4, a process 200 is provided that involves a special repair command but may allow for supplying more failure information to the memory than the process shown in FIG. 3. In step 210, a special repair command is supplied to the memory device to put it in a standby or repair mode. Then, while in this standby mode, in step 220, failure information is supplied to the address lines and DQs. In step 230, the scan pulse is issued to scan the fuse bank, the address lines and the DQs to capture failure information as described above in connection with FIGS. 2 and 3. Next, in step 240, the captured failure information is stored in a latch or other storage location. Steps 230 and 240 are repeated during subsequent dedicated time slots to capture one failure address during each time slot until all of the failure information is captured, or until no further time slots are available. Because several failure addresses may be supplied to the memory device, there may be several latches each of which stores a failure address.

Steps 250 and 260 are performed during normal operation to compare incoming address requests with the failure information and permit access to the incoming address request if there is not a match, and otherwise direct access to a redundant (dedicated or non-dedicated) row or column if there is a match.

In step 270, the failure information may be transferred to a more permanent storage. For example, in response to a failure store command, the information in the latches is transferred to other storage on chip, such as electronic-fuses, to electronically erasable programmable read only memory (EEPROM) on the memory module, or to other permanent system memory, such as a hard drive storage device.

The process 200 may require changes to certain device standards, such as the JEDEC standard (e.g. definition of new commands, feedback of repair success information to the controller or tester device, etc.). Nevertheless, an added benefit of providing a user repair command is that the user can restore fuse information on the memory device without powering down the system and restarting it.

Before resuming normal memory operation, the data from the normal memory array is copied to the dedicated redundant columns or rows. The sequence of events then becomes: read content from failed memory elements; perform error correction on the data read from the memory elements and store the error-corrected data to a temporary storage location (e.g., working memory elements or a hard disk); put memory device into standby mode; repair the memory using the process shown in FIG. 4, write the corrected data back to memory so that the data is written to dedicated redundant memory elements; and resume normal operation.

As still a further variation on the embodiment shown in FIG. 4, the memory device may be designed with dedicated logic to receive and store externally supplied failure information for processing against an incoming address request.

Figure 5:
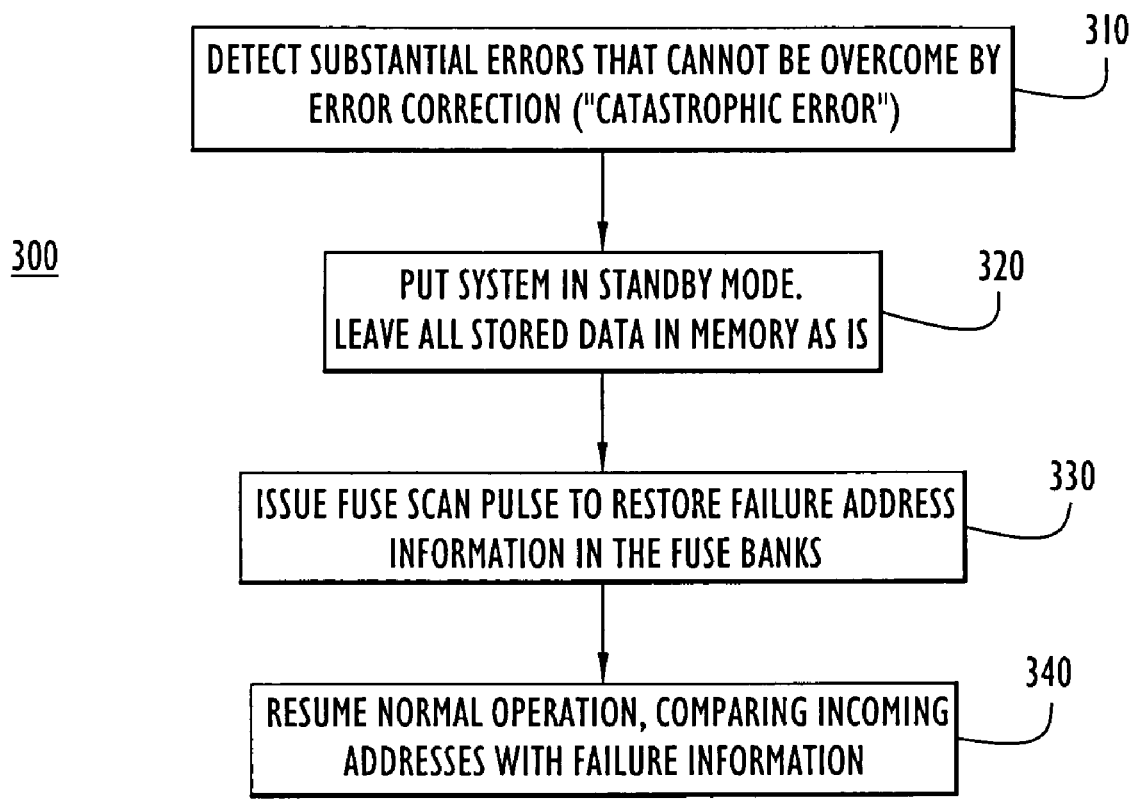
FIG. 5 is a flow chart according to a third embodiment of the invention.

Turning to FIG. 5, still another aspect of the invention will be described. It is possible that the failure information stored in the fuse latches may become corrupted or destroyed caused by alpha particles hitting the fuse latches. Accordingly, a process 300 is provided to restore the information stored in the fuses. In step 310, errors associated with accessing memory cells are monitored in order to detect when and if there are substantial errors that cannot be overcome by error correction techniques. Such errors may be called catastrophic errors. In the event a catastrophic error condition is detected in step 310, then in step 320, the system is put in a standby mode during which time all data stored in the memory device is maintained as is; no further writing occurs. The command to put the memory device in standby may be an externally-supplied command that is made after a system user (or application) is informed of the condition and a system user has indicated the desire to initiate the standby mode and re-issue the fuse pulse. Next, in step 330, the fuse pulse is re-issued to scan across the fuse banks and thereby restore the failure address information contained in the fuse banks to corresponding fuse latches. Then, in step 340, normal system operation is resumed with the restored failure address information (from the fuse banks) and a read of the memory device is attempted. The process 300 may not guarantee a fully successful recovery, but is sufficient to deal with at least short-term contamination issues. This process 300 also gives a system user a way of dealing with certain causes of catastrophic errors that may be caused by cosmic rays and in many cases the error is fully recoverable because the correct information stored in the redundant elements of the memory device is still available as long as no write access was in progress when the catastrophic failure event occurred. The data may be copied (and error-corrected) into other memory on a temporary basis prior to performing the restore process.

The techniques described herein allow for use of memory with known failed addresses (which is much cheaper than perfect memory) and/or the system user could improve the reliability of the system by constantly repairing addresses appearing in the failure logs. By repairing failures as they occur, system reliability is improved.

Figure 6:
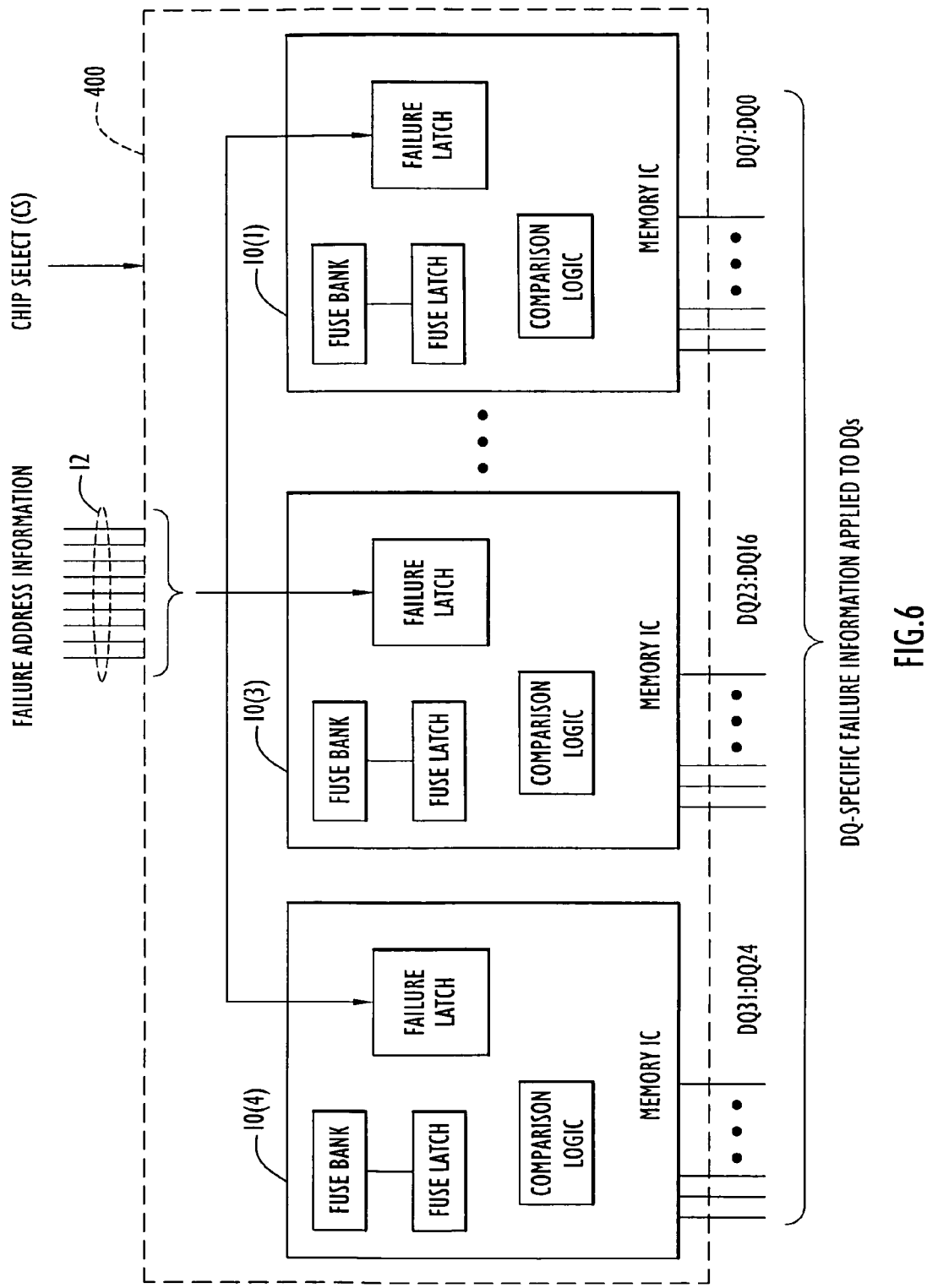
FIG. 6 is a block diagram showing the invention in the context of a memory module.

The techniques described herein may be extended to repairing cells on one or more memory chips on a memory module. FIG. 6 shows a memory module 400 comprising a plurality of memory ICs 10(1), 10(2) . . . , 10(4). On the memory module 400, each memory chip can be uniquely identified by the chip select (CS) signal and the DQs which that memory chip serves. One of the memory ICs can be selected based on DQ-specific failure information and the CS signal so that the failure address information supplied to the address lines is processed by the appropriate one of the memory ICs. Moreover, the DQ-specific failure information can be used by a memory IC, in combination failure address information, to make repairs down to the cell level. To make a repair, the CS signal to the memory module 400 is made high, failure address information is supplied to the address pins 12, and DQ-specific failure information is supplied to the DQs. For example, the DQ-specific failure information may comprise a pre-defined signal, e.g., all failing DQ=logical one and all passing DQ=logical zero, and the memory components accept the failure information into its latches similar to the techniques described above in conjunction with FIGS. 2 and 3. It should be understood by those with ordinary skill in the art that these techniques may be extended to providing failure information consisting of a failure address (row, column), bank identifier and DQ so as to identify a particular memory cell in a large memory array network.

The system and methods described herein may be embodied in other specific forms without departing from the spirit or essential characteristics thereof. The foregoing embodiments are therefore to be considered in all respects illustrative and not meant to be limiting.

What is claimed is:

1. A method for repairing an integrated circuit memory device comprising:
   receiving at address pins of the memory device an externally-supplied signal containing failure information that identifies at least a row or column of memory cells in the memory device that has a failure, wherein the failure information is derived from monitoring the memory device during normal operation of a host computer system that uses the memory device; and
   performing memory access operations of the memory device during normal operation using at least one of a redundant row of memory cells and a redundant column of memory cells in the memory device on the basis of the received externally-supplied signal to repair the memory device.

2. The method of claim 1, wherein receiving comprises receiving a bit pattern supplied to address pins of the memory device, wherein the bit pattern identifies the row or column that has a failure; and further comprising storing the bit pattern for use in comparison against an address in an incoming address request.

3. The method of claim 2, and further comprising scanning a fuse pulse across the address pins to which the bit pattern is supplied to transfer the bit pattern to a latch.

4. The method of claim 1, wherein receiving comprises receiving failure information comprising at least one address containing a failure and at least one data line for that address that has a failure.

5. The method of claim 4, wherein receiving comprises receiving failure information comprising at least one address on a memory module comprising a plurality of memory devices and at least one data line for that address that has a failure among a plurality of data lines that span the plurality of memory devices on the memory module.

6. The method of claim 1, wherein receiving is performed during a time interval at power up of the memory device.

7. The method of claim 1, wherein receiving is performed during a standby mode initiated by a repair command supplied to the memory device, and is repeated to obtain failure information for each of a plurality of rows or columns having a failure.

8. The method of claim 1, wherein receiving comprises receiving the failure information which is derived from monitoring operation of the memory device in a host computer system.

9. An integrated circuit memory device, comprising:
   at least one fuse bank that stores failure information and at least one fuse latch that latches the failure information stored in the at least one fuse bank when a fuse pulse is scanned across the at least one fuse bank:
   a latch coupled to address pins of the device, wherein the latch stores failure information included in an externally supplied command that is coupled to the address pins of the device, wherein the failure information identifies at least a row or column of memory cells in the device that has a failure, wherein the latch stores the failure information contained in the externally supplied command when the fuse pulse that is scanned across the at least one fuse bank is also scanned across the address pins of the memory device.

10. The device of claim 9, and further comprising a comparison circuit coupled to the latch that compares an incoming address request to the memory with the failure information so as to cause access of a redundant row or column if there is a match.

11. The device of claim 9, wherein the latch further stores information supplied to data lines of the device that identifies at least one failing memory cell at an address corresponding to the failure information supplied to the address pin.

12. The device of claim 9, wherein the latch stores the failure information which is derived from monitoring operation of the device in a host computer system.

13. A method for repairing an integrated circuit memory device comprising:
  first scanning a fuse pulse across at least one fuse bank to transfer failure information contained in the fuse bank to at least one fuse latch; and
  second scanning the fuse pulse across address pins to which is supplied an external signal containing additional failure information to transfer the additional failure information to a latch.

14. The method of claim 13, and further comprising third scanning the fuse pulse across data lines of the memory device to which is supplied a signal indicating at least one data line that is failing at the address represented by the signal supplied to the address pins.

15. The method of claim 13, wherein said second scanning is repeated across the address pins to obtain failure information representing each of a plurality of rows or columns having failures.

16. The method of claim 13, and further comprising:
  comparing the failure information with an incoming address request to the memory device; and
  accessing a redundant memory cell if the incoming address request matches the failure information.

17. The method of claim 16, and further comprising:
  assigning dedicated redundant rows and columns for rows or columns having failures that are represented by the additional failure information contained in the externally-supplied signal; and
  wherein accessing comprises accessing one of said dedicated rows and columns with the incoming address request matches the additional failure information.

18. The method of claim 17, wherein accessing comprises accessing a redundant row or column, different from said dedicated rows and columns, when the incoming address request matches failure address information derived from information contained in one or more fuse banks in the memory device.

19. The method of claim 13, wherein the additional failure information is derived from monitoring operation of the memory device in a host computer system.

20. A method for restoring failure address information contained in a fuse bank of a memory device, comprising:
  monitoring the memory device during normal operation of a host computer system that uses the memory device to determine when substantial errors are occurring in connection with a row or column of memory cells;
  in response to detecting said substantial errors, placing the device in a standby mode; and
  scanning a fuse pulse across the fuse bank to transfer and restore failure information contained in the fuse bank to a fuse latch.

21. The method of claim 20, wherein placing is further responsive to an externally-supplied command.

22. The method of claim 20, wherein monitoring comprises monitoring operation of the memory device in a host computer system, and further comprising:
  generating the failure information based on the row or column of memory cells determined to exhibit substantial errors; and
  supplying a command to the memory device to cause said placing of the memory device in the standby mode.

23. The method of claim 20, wherein monitoring comprises monitoring the memory device to determine substantial errors which are errors that cannot be overcome by error correction techniques.

24. An integrated circuit memory device, comprising:
  a. storing means for storing failure information included in an externally supplied command coupled to the address pins of the device, wherein the failure information identifies at least a row or column of memory cells in the device that has a failure, wherein the failure information is derived from monitoring the memory device during normal operation of a host computer system that uses the memory device; and
  b. comparing means for comparing during normal operation an address in an incoming address request with the failure information stored in the means for storing, said comparing means causing access to a redundant memory cell if the incoming address request matches the failure information.

25. The device of claim 24, wherein the storing means stores the failure information when a fuse pulse that is scanned across at least one fuse bank is also scanned across the address pins on the memory device.

26. The device of claim 24, wherein the storing means stores the failure address information during a time interval at power-up of the device.

27. The device of claim 24, wherein storing means stores the failure address information during a standby mode entered in response to receiving an externally supplied repair command.

28. The device of claim 24, wherein the storing means further stores information supplied to data lines of the device that identifies at least one failing memory cell at an address corresponding to the failure information supplied to the address pin.

* * * * *